US009620625B2

(12) United States Patent
Ishihara et al.

(10) Patent No.: US 9,620,625 B2
(45) Date of Patent: Apr. 11, 2017

(54) MANUFACTURING A SUBMICRON STRUCTURE USING A LIQUID PRECURSOR

(71) Applicant: Technische Universiteit Delft, Delft (NL)

(72) Inventors: Ryoichi Ishihara, Delft (NL); Michiel Van Der Zwan, Delft (NL); Miki Trifunovic, Delft (NL)

(73) Assignee: TECHNISCHE UNIVERSITEIT DELFT (NL)

( * ) Notice: Subject to any disclaimer, the term of this patent is extended or adjusted under 35 U.S.C. 154(b) by 0 days.

(21) Appl. No.: 14/764,516

(22) PCT Filed: Jan. 28, 2014

(86) PCT No.: PCT/NL2014/050045
§ 371 (c)(1),
(2) Date: Jul. 29, 2015

(87) PCT Pub. No.: WO2014/120001
PCT Pub. Date: Aug. 7, 2014

(65) Prior Publication Data
US 2015/0380524 A1    Dec. 31, 2015

(30) Foreign Application Priority Data

Jan. 29, 2013    (NL) .................................... 2010199

(51) Int. Cl.
*H01L 21/02*    (2006.01)
*H01L 29/66*    (2006.01)
(Continued)

(52) U.S. Cl.
CPC .. *H01L 29/66757* (2013.01); *H01L 21/02532* (2013.01); *H01L 21/02623* (2013.01);
(Continued)

(58) Field of Classification Search
CPC ......... H01L 21/02656; H01L 21/02532; H01L 21/02623; H01L 21/02664
See application file for complete search history.

(56) References Cited

U.S. PATENT DOCUMENTS

| 6,861,365 B2 | 3/2005 | Taussig et al. |
| 2005/0170076 A1 | 8/2005 | Seki et al. |

(Continued)

FOREIGN PATENT DOCUMENTS

| EP | 1087428 A1 | 3/2001 |
| WO | 2009027627 A1 | 3/2009 |
| WO | 2013034312 A1 | 3/2013 |

OTHER PUBLICATIONS

International Search Report + Written Opinion Application No. NL 2014 050045 Completed: Feb. 18, 2014; Mailing Date: Feb. 25, 2014 9 Pages.

*Primary Examiner* — Douglas Menz
(74) *Attorney, Agent, or Firm* — St. Onge Steward Johnston and Reens, LLC

(57) ABSTRACT

A method for manufacturing a submicron semiconductor structure on a substrate, including: forming at least one template layer over a support substrate; forming one or more template structures, including one or more recesses and/or mesas, in the template layer, the one or more template structures including one or more edges extending into or out of the top surface of the template layer; coating at least part of the one or more template structures with a liquid semiconductor precursor; and, annealing and/or exposing the liquid semiconductor precursor coated template structures to light, wherein during the annealing and/or light exposure a part of the liquid semiconductor precursor accumulates by capillary forces against at least part of the one or more edges, the annealing and/or light exposure transforming the accumulated liquid semiconductor precursor into a submicron (Continued)

semiconductor structure extending along at least part of the one or more edges.

27 Claims, 10 Drawing Sheets

(51) Int. Cl.
| | |
|---|---|
| H01L 29/786 | (2006.01) |
| H01L 27/12 | (2006.01) |
| H01L 21/268 | (2006.01) |
| H01L 21/324 | (2006.01) |
| H01L 29/04 | (2006.01) |
| H01L 29/06 | (2006.01) |
| H01L 29/16 | (2006.01) |
| B82Y 30/00 | (2011.01) |

(52) U.S. Cl.
CPC .. *H01L 21/02656* (2013.01); *H01L 21/02664* (2013.01); *H01L 21/2686* (2013.01); *H01L 21/324* (2013.01); *H01L 27/1218* (2013.01); *H01L 27/1222* (2013.01); *H01L 27/1292* (2013.01); *H01L 29/04* (2013.01); *H01L 29/0669* (2013.01); *H01L 29/16* (2013.01); *H01L 29/78666* (2013.01); *H01L 29/78675* (2013.01); *H01L 29/78696* (2013.01); *B82Y 30/00* (2013.01)

(56) References Cited

U.S. PATENT DOCUMENTS

| | | | |
|---|---|---|---|
| 2006/0073680 A1* | 4/2006 | Han | B82Y 10/00 438/479 |
| 2006/0258132 A1* | 11/2006 | Brown | B82Y 10/00 438/610 |
| 2008/0303029 A1 | 12/2008 | Kawashima et al. | |
| 2009/0197209 A1* | 8/2009 | Penner | B82Y 10/00 430/320 |
| 2012/0064302 A1 | 3/2012 | Shimoda et al. | |
| 2014/0339611 A1* | 11/2014 | Leobandung | H01L 29/78609 257/288 |

* cited by examiner

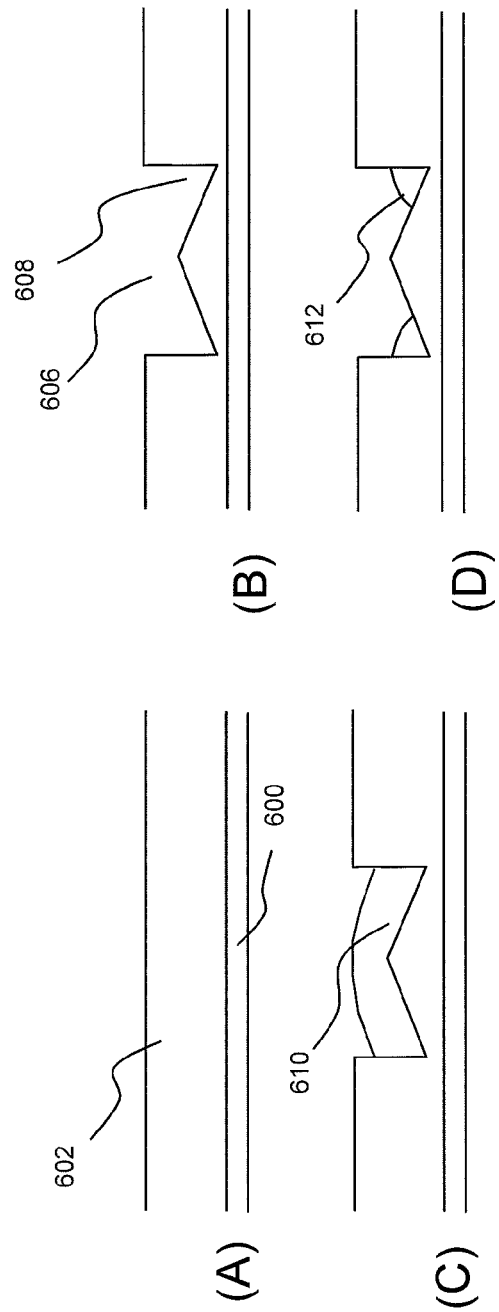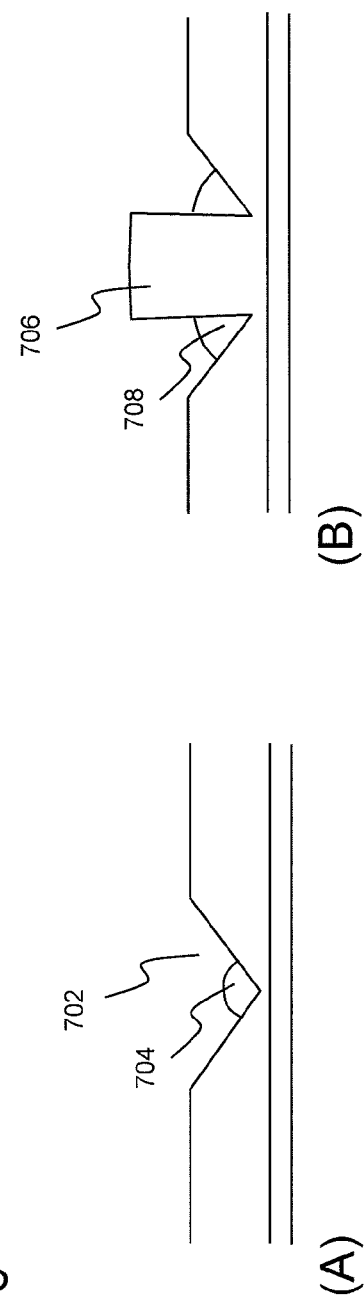
Fig. 6
Fig. 7

MANUFACTURING A SUBMICRON STRUCTURE USING A LIQUID PRECURSOR

FIELD OF THE INVENTION

The invention relates to manufacturing of a submicron structure, preferably a semiconducting submicron structure, using a liquid precursor, and, in particular, though not exclusively, to at least a method for manufacturing a submicron structures on a substrate and a submicron structure obtainable by such method.

BACKGROUND OF THE INVENTION

Semiconductor devices, such as diodes and transistors are essential components for electronic devices. A continuing demand exists for new, alternative, less expensive and/or improved manufacturing processes for their production. Currently, a particular interest exists in processes for the production of flexible electronics components for use e.g. in RFID tags, flexible LED and LCD displays and photovoltaics. A very promising technique for producing flexible electronics is the so-called roll-to-roll (R2R) fabrication technique (also known as web processing or reel-to-reel processing). R2R fabrications techniques include production methods wherein thin-films are deposited on a flexible (plastic) substrate and processed into electrical components in a continuous way.

In an R2R process preferably printing techniques (e.g. imprint, inkjet, or screen printing) and coating techniques (e.g. roll, slit coating or spray coating) are used in order to achieve high throughput, low-cost processing. Such techniques include the use of inks, i.e. liquid precursors, which can be deposited on the substrate using a simple coating or printing technique. This way, flexible electronics may be fabricated at a fraction of the cost of traditional semiconductor manufacturing methods. R2R processing is however a technology which is still in development.

Problems that need to be overcome in order realize flexible electronics for high-performance applications, such as UHF RFIDs and electronics for foldable phones, include the development of low-cost processes for the realization of thin-film structures with small feature size and high alignment accuracy; and, the development of ink-based processes for realizing high-mobility semiconducting thin-films on a flexible plastic substrate.

U.S. Pat. No. 6,861,365 B2 describes the realization of a three-dimensional resist structure on a thin-film semiconductor multilayer stack on a flexible substrate by imprinting a structured mold into a resist layer. Subsequent (anisotropic) etching of the 3D mask allows the formation of thin-film semiconducting structures in the multilayer stack. The minimum feature size and the alignment accuracy are determined by the 3D mask, which is further determined by the photolithography. The etching steps are based on vacuum processes thus providing a R2R process with an inefficient energy consumption and material usage. Moreover, although the 3D resist mask provides the required alignment, it introduces substantial design constrains and processing complexity.

US2012/0064302 describes a patterning method for obtaining semiconductor structures using a micro or nanoimprint process. In this method a substrate is coated with UV-exposed cyclopentasilane (CPS) layer and an imprint mold is pressed into the layer in order to transfer the structure of the imprint mold into the layer. Thereafter, the substrate with the layer having the mold pressed therein is annealed for a predetermined time so that the patterned CPS coating is transformed into amorphous silicon. After cooling down the mold may be removed. Although this method enables the formation of submicron structures on a substrate on the basis of CPS without the need of complex (vacuum) processing techniques, the method requires a relatively expensive nano-imprint mold in order to form structures with submicron features.

Hence, there is a need for in the art for improved methods for manufacture of submicron structures on a substrate using liquid precursors and small submicron structure obtainable by such methods.

SUMMARY OF THE INVENTION

It is an objective of the invention to reduce or eliminate at least one of the drawbacks known in the prior art. In a first aspect the invention may relate a method for manufacturing a submicron, preferably a nano-sized, semiconductor structure wherein the method may comprise: forming at least one template layer over a support substrate; forming one or more template structures, preferably one or more recesses and/or mesas, in said template layer, said one or more template structures comprising one or more edges extending into or out of the top surface of said template layer; coating at least part of said one or more template structures with a liquid semiconductor precursor, preferably a liquid silicon precursor; and, annealing and/or exposing said liquid semiconductor precursor coated template structures to light, wherein during said annealing and/or light exposure a part of said liquid semiconductor precursor accumulates by capillary forces against at least part of said one or more edges, said annealing and/or light exposure transforming said accumulated liquid semiconductor precursor into a submicron semiconductor structure extending along at least part of said one or more edges.

Hence, the method uses a template structure on a support substrate for enabling the formation of semiconductor structures of submicron cross-section using a semiconductor liquid precursor (a semiconductor ink). On the basis of this process, self-aligned semiconductor filaments or wires along the edges (sidewalls) of a recess or a mesa may be formed by controlled wetting of the edges by the semiconductor precursor. The height and angular orientation of the sidewalls and the amount of ink that is concentrated against the sidewalls determine the cross-sectional dimensions (the width) of the filament.

In an embodiment said submicron semiconducting structure may comprises one or more submicron or nano-sized semiconducting wires (filaments) formed against at least part of said one or more edges or side-walls. In a further embodiment, said submicron or nano-sized semiconductor wires may have a cross-sectional dimensions selected in a range between 20 and 800 nm, preferably between 50 and 600 nm, more preferably between 100 and 500 nm.

In one embodiment, said one or more edges may define at least part of a recess and/or a mesa, wherein the height of said recess and/or mesa being selected between 20 and 2000 nm, preferably 40 and 1000 nm, more preferably between 50 and 500 nm. In another embodiment, said recess and/or mesa has a width selected from a range between 40 nm and 5000 nm, preferably between 80 nm and 2000 nm, more preferably between 100 nm and 1000 nm. Hence, the method thus allows the formation of submicron or even nano-sized semiconductor structures using micron wide recesses and/or mesas which may be easily fabricated on the basis of a conventional micro-imprinting or printing technique.

In an embodiment, the topology said one or more recesses and/or mesa is selected such that said accumulation of said liquid semiconductor precursor against said one or more edges by said capillary forces is stimulated. In an embodiment, the angle between said one or more edges and the top surface of said template layer is selected between 30 and 120 degrees. The slope of the edges (sidewalls) may be used to control the wetting and hence the accumulation of the liquid semiconducting precursor against the edges. Similarly, the base of a recess or a mesa may be sloped (e.g. a V-shaped recess or a V-shaped base around a mesa) in order to increase the accumulation of the liquid semiconductor precursor against the edges.

In an embodiment, said one or more recesses have a substantially trapezoidal, rectangular, or triangular (V-shaped) cross-section.

In an embodiment, at least part of said one or more edges comprise a material that has a high affinity for the liquid semiconductor precursor, preferably said material comprising a metal and/or said material being exposed to a surface treatment. In an embodiment said template layer may comprise at least a first and second template layer wherein said first template layer may comprising a material that has a higher affinity for the liquid semiconductor precursor than the material of said second template layer. Hence, the material of the template layer or layers may be selected that certain parts of a template structure has a higher affinity for the liquid semiconductor precursor than other parts of the template structure.

In an embodiment said annealing may include heating at least part of said coated template structures to a temperature which is higher than the boiling temperature of said liquid semiconductor precursor. Hence, a submicron semiconducting structure may be formed by subjecting template structures coated with a liquid semiconductor precursor such as CPS to a temperature anneal so that during the anneal a significant amount of the CPS is drawn towards and upwards against the sidewalls of a recess or a mesa due to the capillary forces. For relatively wide recesses, the capillary forces are able to keep a sufficient amount of CPS for a sufficient period of time pinned against the sidewalls so that the accumulated CPS can be transformed into amorphous silicon. The same may apply to the submicron recesses wherein the capillary forces pin the CPS in the submicron recess thereby enabling the transformation of the CPS into amorphous silicon before the CPS is evaporated.

Moreover, little to no silicon was found in the recesses away from the sidewalls. Also the top surface of the template structure was substantially free from excess material, indicating that the CPS in those areas was evaporated indeed. Hence, coating a template structure with pure CPS and annealing the CPS at a temperatures between 250° C. and 350° C., results in the formation of amorphous silicon submicron structures in the recesses, while the rest of the template structure was substantially free from CPS and/or amorphous silicon material.

In an embodiment said annealing may include heating at least part of said coated template structures to a temperature selected between 180 and 350° C., preferably between 190 and 340° C., more preferably between 200 and 320° C.

In an embodiment, said light exposure includes exposing at least part of said one or more coated template structures to light comprising one or more wavelengths selected between 200 nm and 400 nm; and/or, exposing said one or more coated template structures with light associated with an energy density selected in the range between 10 and 1000 mJ/cm$^2$, preferably 20 and 600 mJ/cm$^2$, more preferably 40 and 600 mJ/cm$^2$.

In a further embodiment, said method may comprise coating at least of part of said template structures with a liquid silicon precursor or doped liquid silicon precursor. In an embodiment said silane-based liquid silicon precursor may be represented by the general formula $Si_nX_m$, wherein X is a hydrogen; n is an integer of 5 or greater, preferably an integer between 5 and 20; and m is an integer of n, 2n–2, 2n or 2n+1; more preferably said silane-based liquid silicon precursor comprising cyclopentasilane (CPS) and/or cyclohexasilane. In another embodiment, said doped silane-based liquid silicon precursor may be represented by the general formula $Si_iX_jY_p$, wherein X represents a hydrogen atom and/or halogen atom and Y represents an boron atom or a phosphorus atom; wherein i represents an integer of 3 or more; j represents an integer selected from the range defined by i and 2i+p+2; and, p represents an integer selected from the range defined by 1 and i.

In an embodiment, said method may comprise: annealing said coated template structures at a temperature higher than 200° C., preferably at a temperature selected between 200 and 350° C., for transforming at least part of said liquid silicon precursor into amorphous silicon;

In another embodiment, said method may comprise: exposing said coated template structures to light, preferably light comprising one or more wavelengths selected between 200 nm and 800 nm, for transforming at least part of said liquid silicon precursor into a solid-state silicon, preferably amorphous silicon, polycrystalline silicon, mirco-crystalline silicon or nano-crystalline silicon.

In an embodiment, forming said one or more template structures may include: forming a template layer by coating the top surface of said support substrate with a liquid dielectric precursor, preferably said liquid dielectric precursor comprising a polymer, a metal precursor or a metal-oxide dielectric precursor; annealing said template layer; embossing at least part of said template structures into said template layer using an imprint technique, preferably a micro-imprint or a nano-imprint technique.

In an embodiment, said support substrate may comprise at least one of: a flexible substrate layer, preferably a metallic or plastic substrate layer; a silicon layer, preferably said silicon layer comprising amorphous silicon, polycrystalline silicon, micro-crystalline silicon or nano-crystalline silicon; and/or, a gate insulating layer.

In an embodiment, said method may comprise: doping at least part of said semiconducting submicron structure.

In an embodiment, said method may comprise: forming one or more contact electrodes, preferably one or more metal contact electrodes, to said submicron semiconducting structure.

In an embodiment, said submicron semiconducting structure may be used as a submicron semiconductor channel or a submicron gate of a thin-film transistor.

In a further aspect, the invention may relate to a semiconductor submicron structure comprising: a template layer on a flexible support substrate, preferably a plastic substrate, said template layer comprising one or more template structures, said template structures comprising at least one recess; wherein the height of said recess may be selected between 40 and 800 nm, preferably 50 and 700 nm, more preferably between 60 and 600 nm; and, wherein at least one semiconducting submicron structure may be arranged against said at least one recess, preferably said silicon being amorphous silicon or polysilicon.

The invention will be further illustrated with reference to the attached drawings, which schematically will show embodiments according to the invention. It will be understood that the invention is not in any way restricted to these specific embodiments.

BRIEF DESCRIPTION OF THE DRAWINGS

FIG. 6A-6D schematically depicts process for forming at least part of a submicron semiconducting structure according to an embodiment of the invention.

FIGS. 7A and 7B schematically depicts a process for the manufacture of at least part of a semiconducting device according to an embodiment of the invention;

DETAILED DESCRIPTION OF THE INVENTION

Figure 1:
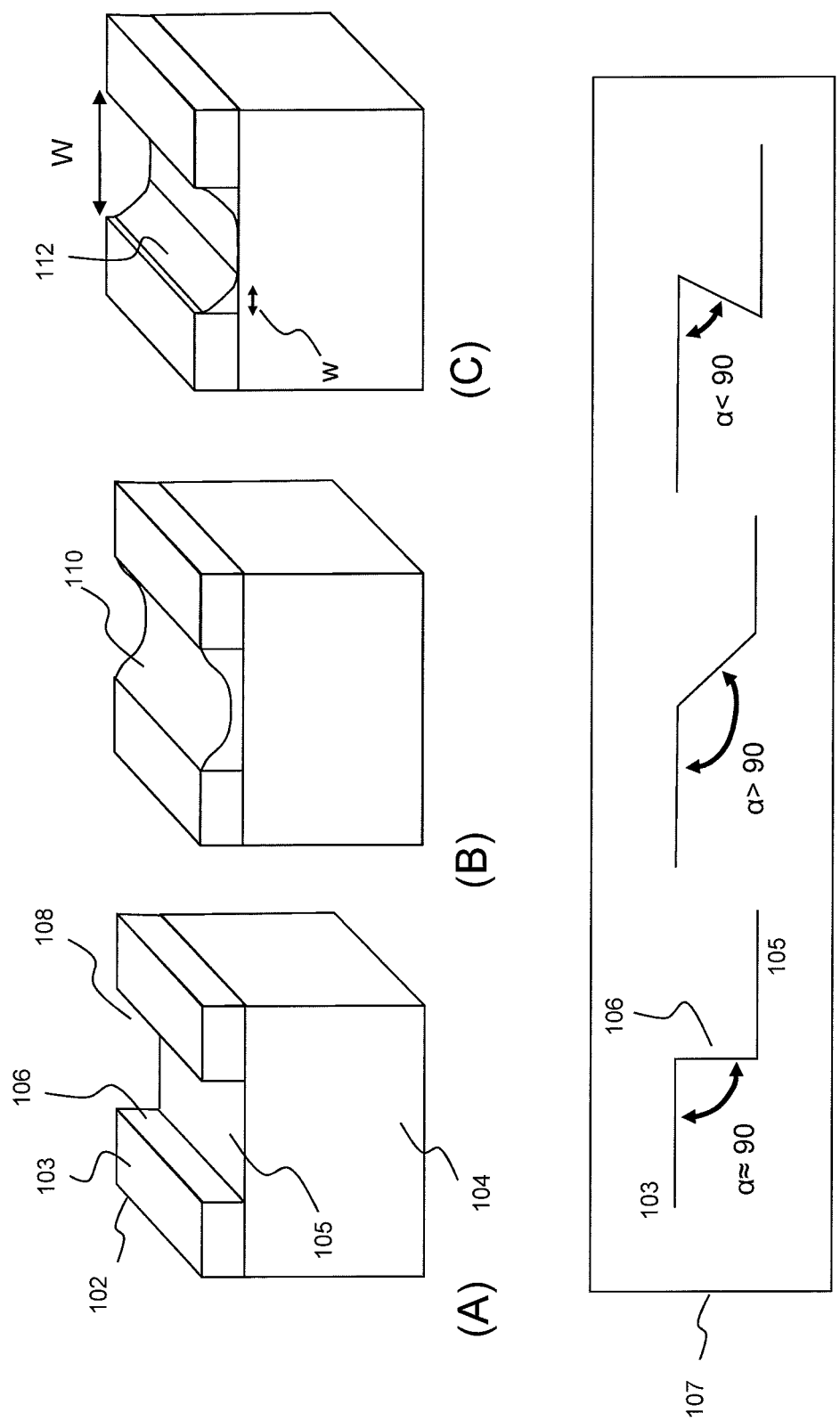
FIG. 1A-1C schematically depicts a process for forming at least part of a submicron structure according to an embodiment of the invention.

FIG. 1A-1C schematically depict a process for forming a submicron structure according to an embodiment of the invention. As depicted in FIG. 1A, the process may start with the formation of template structures (e.g. recess and/or mesas in the surface of a template layer 102.

In one embodiment, the formation of the template structures may include forming one or more recessed regions (trenches or indentations) in the surface of a substrate 104. In one embodiment, patterning a thin-film template layer 102 on the surface of a support substrate 104 may form a recessed region 108. The substrate may be a flexible (support) substrate comprising one or more (thin-film) plastic and/or metal sheets or foils, e.g. polyimide, PEN, PPS), a fibre-reinforced resin composites and stainless steel sheets. Depending on the particular application, a substrate may further include on or more semiconducting and/or insulation layers.

In one embodiment, the patterned template layer may comprise one or more recessed regions 108 in its top surface 103. The recessed regions may be defined by one or more edges 106 extending into the template layer. An edge may define a face 106 which is oriented under angle α with the (top) surface of the template layer (or if applicable the base 105 of the recess) as schematically depicted in the inset 107.

For example, in FIG. 1A one or more recess surfaces, which are oriented approximately perpendicular to the top surface of the template layer may define sidewalls of a recess. This way, a recess having a substantially rectangular cross-section geometry may be defined. In other embodiments, a recess may be defined by one or more edges formed in the template layer, wherein angle α between the face of such edge and the top surface of the template layer may be smaller or larger than 90 degrees. In one embodiment, the angle α between the face such edge and the top surface of the template layer may be selected between 30° and 120° degrees. In this way, recesses may be formed having trapezoidal or triangular, e.g. V-shaped, cross-sections may be formed. Examples of such embodiments will be described hereunder in more detail.

The cross-sectional geometry of the recess may be formed by patterning the thin-film template layer. In an embodiment, the bottom surface (base) 105 of the recess may be formed by part of the surface of substrate. In that case, the sidewalls and base of the recess may be of different materials. In another embodiment, the patterned template layer may comprise one or more recessed regions formed by sidewalls and a bottom surface of the thin-film template layer.

The template structures may be formed by a known imprint techniques. In one embodiment, a cheap micro-imprint technique may be used. In another embodiment, a nano-imprint technique may be used. Such imprint technique allows formation of a pattern or recessed regions by mechanical deformation of the template layer using an imprint mold. Suitable examples of materials for the imprint mold include metals and hard inorganic materials, e.g. ceramics and quartz. The use of such a mold comprising imprint patterns with dimensions of the order of microns is particularly advantageous because of its mechanical durability and reliability The pattern of an imprint mold may be transferred into the template layer so that recessed and/or mesa regions are formed therein. In one embodiment, the recessed regions in a template layer may be opened in order to expose the top surface of support substrate. The template layer may be an organic layer, e.g. an epoxy or an acrylate of poly-urethane resin or an inorganic dielectric precursor layer, e.g. a silicon dioxide precursor layer or a silicon nitride precursor layer. Similarly, the support substrate may be covered by one or more dielectric layers, e.g. one or more silicon dioxide layers and/or silicon nitride layers, or a metal layer such as aluminium.

In another embodiment, the recessed regions may be formed by a known printing technique, such as gravure printing or screen-printing. In that case, a thin-film ink pattern is transferred from a patterned master to the support substrate. The ink may include a (curable) photo resist or a dielectric precursor. By annealing the ink and, in certain cases, by sintering and/or cross-linking the molecules in the ink, formation of a patterned template layer comprising one or more recessed regions may be realized wherein a recessed region may be defined by one or more sidewalls or edges in the template layer.

The template layer may be patterned to have at least two (opposite) sidewalls 106 extending longitudinally over the support substrate thereby forming (a substantially rectangular cross-sectional) recessed region 108 (which may be referred to in short as a recess, a trench or an indentation). In an embodiment, the height of the recessed region may be determined by the thickness of the patterned template layer. In the present disclosure, a recessed region may have a height selected from a range between 10 nm and about 5000 nm, preferably between 20 nm and about 2000 nm, more preferably between 40 nm and about 1000 nm. In a further embodiment, the height may be selected from a range between 50 and 500 nm. Further, a recessed region may have a width W selected from a range between 40 nm and 5000 nm, preferably between 80 nm and 2000 nm, more preferably between 100 nm and 1000 nm. In certain embodiments, the recess (trench) in the support substrate may form a reservoir or well for receiving a liquid semiconductor, dielectric or metal precursor. Such precursor may be referred to in short as an ink.

FIG. 1B schematically depicts at least part of the recess filled with an ink. The recess may be filled by applying an ink coating of a thickness between 50 and 500 nm over the patterned template layer. Various types of ink may be used. The ink may comprise a semiconductor-, a metal-oxide semiconductor, or metal precursor. In a further embodiment, the ink may comprise a precursor and a solvent. A doctor blade may be used to sweep over the surface of the coated patterned template layer so that the recessed regions may be filled, or at least partially filled, with the ink 110 and excess ink is removed from the top surface 103 of the template layer.

In one embodiment, the ink may comprise a composition of one or more semiconductor precursors, preferably one or more group IV semiconductor precursors, and, optionally, a solvent. The solvent may be used to control the viscosity and/or the wetting properties of the ink. As will be explained hereunder in more detail, the ink may be used to form a semiconducting submicron structure, i.e. a semiconducting structure with nano-scale cross-sectional dimensions, in the recess.

In an embodiment, the semiconductor precursor may comprise one or more silane compounds represented by the general formula $Si_nX_m$, wherein X is a hydrogen; n is preferably an integer of 5 or greater and is more preferably an integer between 5 and 20; m is preferably an integer of n, 2n−2, 2n or 2n+1; wherein part of the hydrogen may be replace by a halogen.

Examples of such silane compounds are described in detail in EP1087428, which is hereby incorporated by reference into this application. Examples of the compounds of m=2n+2 include silane hydrides, such as trisilane, tetrasilane, pentasilane, hexasilane, and heptasilane, and substituted compounds thereof in which hydrogen atoms are partially or completely replaced with halogen atoms. Examples of m=2n include monocyclic silicon hydride compounds, such as cyclotrisilane, cyclotetrasilane, cyclopentasilane, silylcyclopentasilane, cyclohexasilane, silylcyclohexasilane, and cycloheptasilane; and halogenated cyclic silicon compounds thereof in which hydrogen atoms are partially or completely replaced with halogen atoms, such as hexachlorocyclotrisilane, trichlorocyclotrisilane, coctachlorocyclotetrasilane, tetrachlorocyclotetrasilane, decachlorocyclopentasilane, pentachlorocyclopentasilane, dodecachlorocyclohexasilane, hexachlorocyclohexasilane, tetradecachlorocycloheptasilane, heptachlorocycloheptasilane, hexabromocyclotrisilane, tribromocyclotrisilane, pentabromocyclotrisilane, tetrabromocyclotrisilane, octabromocyclotetrasilane, tetrabromocyclotetrasilane, decabromocyclopentasilane, pentabromocyclopentasilane, dodecabromocyclohexasilane, hexabromocyclohexasilane, tetradecabromocycloheptasilane, and heptabromocycloheptasilane. Examples of compounds of m=2n−2 include dicyclic silicon hydride compounds, such as 1,1'-biscyclobutasilane, 1,1'-biscyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]heptasilane, spiro[4,4]nonasilane, spiro[4,5]decasilane, spiro[4,6]undecasilane, spiro[5,5]undecasilane, spiro[5,6]dodecasilane, and spiro[6,6]tridecasilane; substituted silicon compounds in which hydrogen atoms are partly or completely replaced with SiH3 groups or halogen atoms. Moreover, examples of compounds of m=n include polycyclic silicon hydride compounds, such as Compounds 1 to 5 represented by the following formulae, arid substituted silicon compounds thereof in which hydrogen atoms are partially or completely replaced with SiH3 groups or halogen atoms. These compounds may be used as a mixture of two or more types.

An ink comprising one or more silane compounds may be used either without a solvent (e.g. a pure silane compound) or with a solvent. Adding a solvent to the UV exposed silane compound may modify its wetting properties. In preferred embodiments, cyclopentasilane (CPS) $Si_5H_{10}$ and/or cyclohexasilane (CHS) $Si_6H_{12}$ may be used as a silane compound. In an embodiment, the silane compound may be first exposed to UV radiation for a predetermined time such that part of the cyclosilane compound molecules are transformed into polysilane. A UV exposed silane compound is more viscous and has a boiling point, which is higher than the silane compound that is not exposed to UV. Further, in another embodiment, a pure silane compound (such as CPS or CHS) may be used as an ink without exposing it to UV.

The above-mentioned silane compounds provide the advantage that these compounds may be readily converted into silicon, in particular amorphous silicon, by using one or more annealing steps between 200° C. and 350° C. Alternatively and/or in addition, a (pulsed) laser crystallisation step may be used in order to covert the silane compounds into silicon, in particular amorphous silicon or (poly)crystallince silicon. Moreover, such silane compounds are suitable for use in printing techniques.

An ink comprising a liquid-phase compound or precursor that may be transformed into silicon using an annealing step and/or light exposure step may be referred to in this application as liquid silicon (li-Si).

In an embodiment, an ink may comprise semiconducting or metallic nano-particles and/or nanowires, preferably of the group IV semiconductors, e.g., Si nano-particle and/or nanowire or nano-rods dispersed solution.

In another embodiment, an ink comprising a dielectric precursor and, optionally, a solvent may be used. On the basis of such ink, a dielectric structure may be formed in a recess. For example, in an embodiment a dielectric precursor such as fluorosilicic acid ($H_2SiF_6$) may be used in a well-known liquid-phase deposition step in order to form a dielectric layer such as $SiO_2$. Alternatively Tetraethyl orthosilicate (TEOS) or dimethylsufone-oxide (DMSO) may be used as a precursor in the formation of a $SiO_2$ layer. In another embodiment, metal-based silicic acid/boric acid mixtures may be used in a well-known liquid-phase deposition step in order to form a metal oxide layer such as $TiO_2$, $ZrO_2$, $HfO_2$, etc.

In yet another embodiment, an ink comprising metal precursor and, optionally, a solvent may be used. On the basis of such ink a metal or metallic (e.g. a silicide) submicron structure may be formed. In one embodiment the metal precursor may comprise metal nano-particles and/or nano-wires or nano-rods (e.g. Al, Ni, Pd, Pt, Mo, Wi, Ti, Co, etc.) or organometallic compounds.

Examples of suitable solvents for use in an ink composition may include: hydrocarbon solvents such as n-hexane, n-heptane, n-octane, n-decane, dicyclopentane, benzene, toluene, xylene, durene, indene, tetrahydronaphthalene, decahydronaphthalene, and squarane; ether solvents such as dipropyl ether, ethylene glycol, dimethyl ether, ethylene glycol dimethyl ether, ethylene glycol diethyl ether, diethylene glycol dimethyl ether, diethylene glycol diethyl ether, diethylene glycol methyl ethyl ether, tetrahydrofuran, tetrahydropyran, 1,2-dimethoxyethane, bis(2-methoxyethyl) ether, and p-dioxane; and polar solvents such as propylene carbonate, gamma-butyrolacetone, N-methyl-2-pyrrolidone, dimethylformamide, acetonitrile, dimethyl sulfoxide, and cyclohexanone.

In further embodiments, toluene or cyclooctane may be used as a solvent.

The solvent is selected such that it does not react with the precursor during processing. Moreover, preferably its vapour pressure may be selected between 0.001 mmHg and 200 mmHg. A pressure lower than 0.001 mmHg would evaporate the solvent too slow increasing the risk of the solvent remaining in the final layer which would decrease the quality of the properties of the film, e.g. the quality of the silicon film in case of a silane compound precursor is used.

In an embodiment, an additive such as a surfactant may be added to the ink composition in order to modify its wetting properties in a recess. The surfactant may be a fluorine type, a silicon type, or a nonionic type, in a trace amount, if necessary, within a range, which does not impair required functions. The nonionic surfactant improves wettability for applying the solution and leveling of the coating film, and prevents graininess and an orange peel surface of the coating film.

The ink composition may comprise no solvent, at least 20 weight percent solvent, at least 40 weight percent or at least 60 weight percent solvent. When the solvent in the ink is evaporating during an annealing step, the volume of the liquid ink may decrease and the annealed (transformed) precursor may be collected in predetermined areas of the recess region in accordance with the wetting behaviour of the ink.

Wetting is the ability of a liquid to maintain contact with a solid surface so that a liquid spreads out over a substrate surface. Wetting results from intermolecular interactions between the substrate and the liquid when the two are brought together. A force balance between adhesive and cohesive forces determines the degree of wetting (wettability). Dewetting is the opposite of wetting. In that case, a liquid tries to minimize its contact surface with the substrate surface.

The contact angle $\theta$ is the angle at which the liquid-vapour interface meets the solid-liquid interface. For a simple substrate-liquid system, the well-known Young formula $\gamma_S = \gamma_{SL} + \gamma_L \cos\theta$ provides the relation between contact angle ($\theta$) and the surface energy of the substrate $\gamma_S$, the surface energy of the liquid $\gamma_L$ and the substrate-liquid interface $\gamma_{LS}$ respectively. A surface is more wettable when the surface energy of the liquid $\gamma_L$ is low and $\theta$ is low.

The surface energy—and thus the contact angle—may depend on various parameters and/or processing conditions such as temperature, substrate material, substrate surface treatment, the substrate surface morphology and substrate surface topology and e.g. the precursor/solvent ratio in the ink. A substrate material may have a high affinity for a liquid. In that case a liquid may spread over (wet) the substrate surface. Such high affinity materials may also be referred to as hydrophilic (in case of water-based liquids) or lyphofilic. Similarly, a substrate material may have a low affinity for a liquid. In that case a liquid may form a spherical cap on the substrate with contact angle $\theta$. Such low affinity materials may be referred to as hydrophobic (or lyphofobic). The (de)wetting behavior of the ink on the surface of the patterned substrate, including the recesses, may be governed by one or more of these parameters.

In an embodiment, the material of the template layer and the substrate may be configured such that at least part of the sidewall surfaces in the recess may have a higher affinity for the ink than the material of the bottom surface (base) of recess. For example, in one embodiment, the material of the template layer may be selected (and/or treated) such that is the sidewall surfaces have a high affinity for the ink and the top surface of the template structure (outside the recess) may have a low affinity for the ink. In that case, the contact angle of the ink with the sidewalls of the recess may be relatively small (as schematically depicted in FIG. 1C).

For a liquid semiconductor precursor such as cyclopentasilane (CPS), the contact angle may vary depending on the surface substrate material between 10° and 35°. For example, contact angle of around 33.4° was measured when using $Si_2N_3$ as a surface substrate material at room temperature. Lower contact angles between about 12° and 18° were measured when using thermal oxide or $SiO_2$ deposited from TEOS as a surface substrate material.

Surface modification techniques may be used to increase or decrease the contact angle of CPS. For example, in an embodiment, a short HF dip (0.55% HF for 4 minutes) of the $SiO_2$ may be used to increase wetting properties by a decrease in the contact angle of a few degrees. In another embodiment, the affinity for the ink associated with the materials forming the recess may be control be exposing the materials to $CF_4/O_2$ plasma as described in US2005/0170076.

In a further embodiment, the substrate temperature may be used for controlling the wetting of the ink in a recess. This may be used in combination with any of above-mentioned surface treatments. For example, the wettability of the substrate surface by CPS may be increased by increasing the substrate temperature, especially when combined with a surface treatment such as a short HF etch (HF dip). For example, a contact angle of about 5° was measured for the TEOS $SiO_2$ at a substrate temperature of around 75° C.

FIG. 1C depicts a submicron structure in the recessed region according an embodiment of the invention. The structure may be formed by filling a recess of the template layer with an ink using e.g. a doctor blade technique as depicted in FIG. 1B and subjecting the filled recess to an annealing step.

In one embodiment, the ink may comprise liquid semiconductor precursor and a solvent. During an annealing step in an inert atmosphere at a temperature selected between 200 and 400° C., preferably between 250° C. and 350° C. the solvent will start to evaporate causing the liquid to flow towards the sidewalls so that at least a substantial part of the ink will be concentrated ("pinned") in the areas along the sidewalls away from the centre of the recess. Due to the capillary forces, a significant amount of ink will be drawn towards and upwards onto the sidewalls. This way, at least part of the centre of the recess will be dewetted and at least part of the sidewalls will be wetted with the ink thereby forming narrow ink filaments 112 of a submicron (cross-sectional) width w along the sidewalls of the recess. During the annealing the semiconductor, metal or dielectric precursor may be transformed into a solid-state semiconductor, metal or insulator. In case a silane-based semiconductor precursor such as CPS or CHS is used, the silane-based precursor may be transformed into an amorphous or (poly) crystalline silicon.

In another embodiment, formation of semiconducting filaments along the sidewalls of the recess may be achieved by exposing a photosensitive (semiconductor) ink with UV-radiation. A photosensitive semiconductor precursor may comprise one or more silane compounds, such as CPS, of the general formula $Si_nX_m$ as described with reference to FIG. 1B. The ink may be exposed with UV light for a predetermined time so that the at least some of the silane compounds are transformed into polysilane chains by photo-polymerization. During this process, the surface energy (or surface tension) of the ink may change (increase), thereby resulting in a change (increase) of the contact angle. This change may result in changes in the dewetting behavior of the ink within the recess. In particular, the polymerization process causes the liquid to flow towards the sidewalls so that at least a substantial part of the ink will be concentrated in the areas along the sidewalls away from the centre of the recess. Due to the capillary forces, a significant amount of ink will be drawn towards and upwards onto the sidewalls. This way ink filaments of submicron cross-sectional width along the sidewalls of the indentation are formed and the centre of the bottom surface of the recess is dewetted. Thereafter, the polysilane containing ink filaments may be transformed in amorphous silicon using an annealing step using e.g. a hot plate in an inert atmosphere at a temperature selected between 200 and 400° C., preferably between 250 and 350° C. The annealing period may be selected from a range between 1 minute and five hours.

In yet another embodiment, a pure non-UV irradiated silane compound may be used in order to form ink filaments of submicron width along the sidewalls of the recess. Annealing of the silane compound at a temperature selected between 150° C. and 400° C., preferably between 200° C. and 350° C., may cause the liquid to flow towards the sidewalls so that at least a substantial part of the ink will be concentrated in the areas along the sidewalls away from the centre of the recess. Due to the capillary forces, a significant amount of ink will be drawn towards and upwards onto the sidewalls. Although the (bulk) boiling point of the non-UV irradiated silane is typically lower than the annealing temperature, the capillary forces are able to keep a sufficient amount of silane for a sufficient amount of time pinned along the sidewalls allowing the silane compound to be transformed in amorphous silicon filaments positioned along the sidewalls of the recess.

Hence, in the above-described embodiments, a template structure on or in the top surface of a support substrate enables the formation of submicron solid-state (e.g. semiconductor) structures using an ink. Solid-state (semiconducting) filaments (wires) along the sidewalls of a recess may be formed by controlled wetting of the sidewalls of a recess by the ink. The height and angular orientation of the sidewalls and the amount of ink that is concentrated against the sidewalls determine the cross-sectional dimensions (the width) of the filament. In an embodiment, the method may be used to form filaments having a the cross-sectional dimension between 20 and 800 nm, preferably between 50 and 600 nm, more preferably between 100 and 500 nm may be formed.

Although FIG. 1A-1C depict the formation of a longitudinal structure, it is clear for a skilled person that the invention allows formation submicron dielectric, semiconductor and/or metal structures having different shapes including e.g. (partly) rectangular, circular, triangular or combinations thereof by simply adjusting the outer contour of the recess structures in the template layer. Further, metallic or dielectric submicron filaments may be formed in a similar manner using a liquid dielectric or metal precursor instead of a liquid semiconductor precursor such as a silane compound.

When forming amorphous silicon submicron structures as described above with reference to FIG. 1A-1C, the structure may be further exposed to light from a light source emitting within a range selected between 100 and 800 nm, preferably between 200 and 400 nm. Such light sources may include high- and low-pressure mercury lamps, rare-earth gas discharge lamps, YAG laser, argon lasers, excimer lasers, etc. Exposure to such radiation may transform the amorphous silicon into polysilicon. Typical energy densities for transformation into polysilicon may be selected from a range between 50 and 1200 mJ/cm$^2$.

Further, the polysilicon filaments may be doped with boron or phosphorous in order provide a charge carrier mobility of around 100 cm$^2$/V, or more. Doping may be achieved by applying a highly doped spin-on glass (SOG) or a spin-on dopant (SOD) layer onto the amorphous silicon filaments before exposing the coated amorphous silicon filaments to light.

Alternatively, in another embodiment, a liquid semiconductor precursor comprising dopants may be used. In an embodiment, the semiconductor precursor may comprise one or more doped silane compounds represented by the general formula $Si_iX_jY_p$, wherein X represents a hydrogen atom and/or halogen atom and Y represents an boron atom or a phosphorus atom; wherein i represents an integer of 3 or more; j represents an integer selected from the range defined by i and 2i+p+2; and, p represents an integer selected from the range defined by 1 and i.

In yet a further embodiment, one or more metallic (e.g. silver) contact pads (or bonding pads) that are in electrical contact with the filament may be deposited onto the substrate in order to provide electrical connection to the conductive semiconducting (polysilicon) filament.

Hence, from the above, it follows that the invention provides a template-assisted method for forming submicron structures on a patterned substrate using liquid semiconductor, dielectric or metal precursors. The process steps include simple coating and annealing steps, which do not require expensive vacuum deposition and/or etching techniques. Micron-sized template structures in the surface of the substrate or a template layer over a substrate in order to form submicron metallic, dielectric and/or semiconducting structures. The template structures may be formed by known micro-imprinting or printing techniques thus making the method according to the invention particular suitable for cheap and high-throughput roll-to-roll processing.

Figure 2:
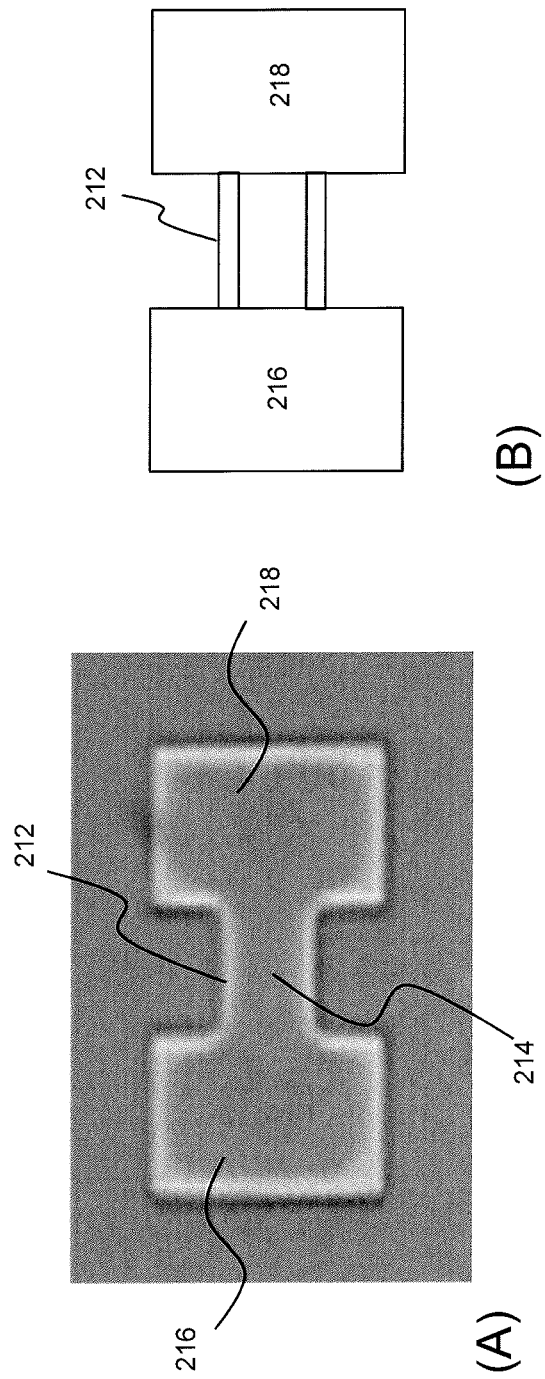
FIGS. 2A and 2B depicts a photo of a top view of a submicron silicon structure and a schematic of a nanowire device using such submicron silicon structure according to an embodiment of the invention.

FIG. 2A depicts a photo of a top view of a submicron silicon structure formed in a recess region according to an embodiment of the invention. The recess may be formed by patterning a template layer, e.g. a TEOS layer, on a substrate as described with reference to FIG. 1A-1C. In this particular example, the recess region may comprise a channel region 214 connecting first and pad regions 216, 218 wherein the channel regions is approximately 5 micron wide, 7 micron long and 250 nm height. The surface of the substrate comprising the recesses was exposed to an oxidation step by exposing the substrate for 8 minutes to a 500 W oxygen plasma. The plasma may modify (increase) the roughness of surface in the recess to that an improved adhesion of the amorphous silicon to the substrate may be achieved.

The sample was transferred inside a glove box (MBRAUN GmbH Glovebox with Gas purification platform MB20/MB200), which facilitates a substantially oxygen free environment (oxygen level<1 ppm). The recess was filled with pure CPS using a doctor-blade coating technique. After filling the recess, the substrate was exposed to UV light (UV AHAND 250GS) for 2 minutes in order to photo-polymerize the CPS. The UV light has a profile of wavelengths ranging from 320 nm to 400 nm with the peak at around 370 nm. In an embodiment, CPS may be exposed to UV for a period selected between 1 and 30 minutes, preferably between 2 and 20 minutes.

During the UV exposure, the remaining CPS in the recess region polymerizes to higher-order polysilanes. Due to the UV exposure the wetting properties of CPS in the recessed regions changes causing dewetting a central part of the bottom surface of the channel region 214 of the recess and causing wetting of the sidewalls of the recess by ink. This way, polysilane ink filaments 212 of submicron cross-sectional dimensions may be formed along the sidewalls of the indentation.

In this particular example, the width w of a filament is approximately 700-800 nm and the maximum height of the filament is approximately 250 nm (similar to the height of the recess). The width of the filament may be controlled by the UV exposure time, substrate temperature, a predetermined surface treatment, selection of the materials for the sidewalls and the bottom surface of the indentation and/or the geometry of the recess (e.g. orientation of sidewalls and/or bottom surface). On the basis of these parameters, the width of a silicon filament may be controlled between 50 and 800 nm, preferably between 100 and 600 nm, more preferably between 150 and 500 nm.

The structure may thereafter be annealed by exposing it to a temperature of 350° C. for 1 hour in a substantially oxygen fee environment in order to transform the polysilane filaments in amorphous silicon filaments and the amorphous silicon may be transported into polycrystalline silicon using a laser irradiation, e.g. a XeCL excimer laser. Typical energy densities for transformation into polysilicon are selected between 50 and 1200 mJ/cm². Remnants of polysilicon in dewetted regions may be present and may be removed using a short wet etch on the basis of a mixture of HF and $HNO_3$.

In an embodiment, the submicron polysilicon filaments may be doped with boron or phosphorous in order to make them conductive and (e.g. aluminum) contact pads may be deposited on the pad regions. This way, a nanowire device as depicted in FIG. 2B may be realized. The nanowire device may comprise two metallic contacts pads 216, 218, which are electrically connected by one or more (in this case two) doped polysilicon nanowires 212. On the basis of the process a conductive channel comprising multiple parallel nanowires between two contact pads may be realized. Further, one or more submicron wide polysilicon filaments may be fabricated over a semiconducting channel region in order to realize TFTs with small gate lengths, which are needed for high-frequency applications.

Figure 3:
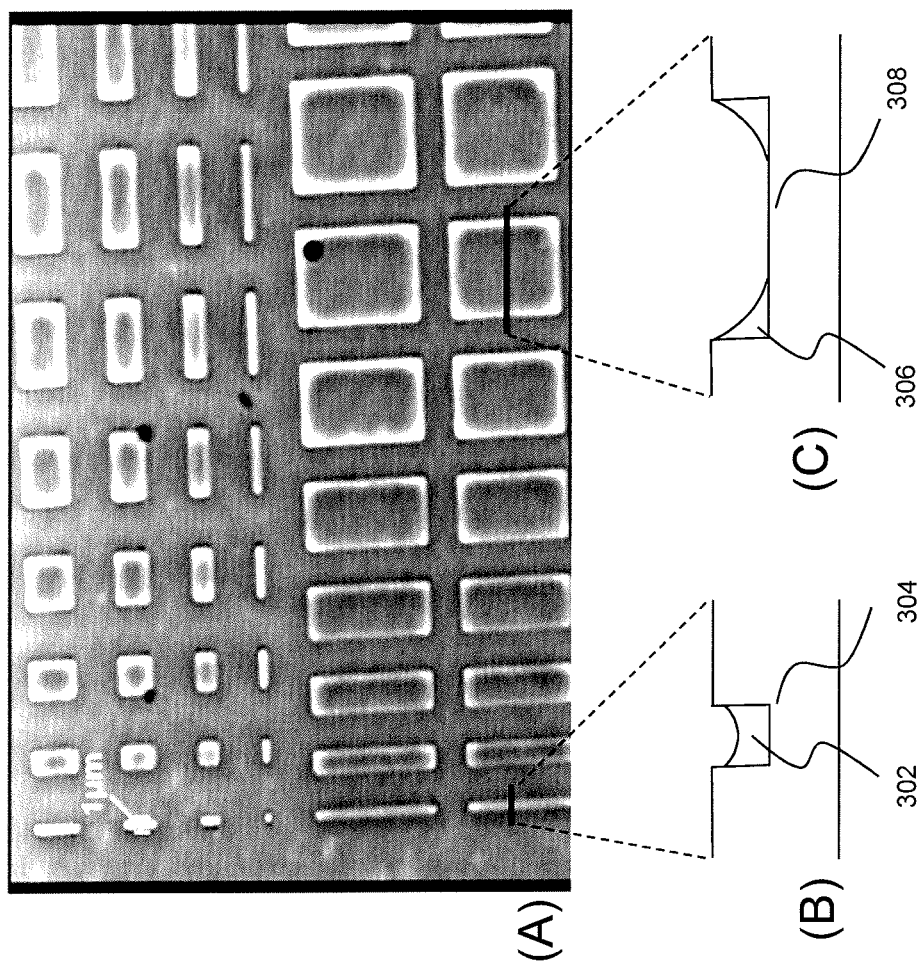
FIG. 3A-3C represent a photo of the top view of various submicron silicon structures and associated schematic cross-sections of the photographed structures according to various embodiments of the invention.

FIG. 3A-3C represent a photo of the top view of various submicron silicon structures and associated schematic cross-sections of the photographed structures according to various embodiments of the invention. FIG. 3A represents a photo of the top view of a substrate comprising a template structure on its top surface. The template structure may comprise recesses of different dimensions. The recesses may have a depth of 250 nm and a width, which may vary between 500 nm and 5 micron. The submicron amorphous silicon structures where formed by coating the template structures a layer of CPS (without any solvent) having a thickness of about 200 nm. A doctor blade was used to sweep over the patterned surface so that the recessed regions were filled, or at least partially filled, with the ink and excess CPS is removed. In this particular case, the recesses were filled with, non-UV irradiated CPS. Thereafter, the substrate including the CPS filled recesses were annealed at a temperature of 350° C. for 1 hour in a substantially oxygen-free environment. Surprisingly, during annealing submicron amorphous silicon structures were formed in the recess.

In particular, in the recesses of submicron width 204 amorphous silicon 302 filled the recess almost completely as schematically depicted in FIG. 3B. Furthermore, in the recesses of (a few) microns width 308, submicron amorphous silicon filaments 306 were formed in the edges against the sidewalls of the recesses, while the rest of the base of the recess was substantially free of amorphous silicon as schematically depicted in FIG. 3C.

This result is surprising as the (bulk) boiling point of CPS is 194° C. Hence, when annealing the CPS at a temperatures between 250° C. of 350° C., it is expected that the CPS would evaporate before any amorphous silicon can be formed on the surface of the substrate. Nevertheless, the experimental data show that amorphous silicon filaments having a width between 300 nm and 600 nm are formed along the edges of relatively wide recesses (one micron and more) and that small submicron recesses were almost completely filled with amorphous silicon.

These results show that during annealing a significant amount of the CPS is drawn towards and upwards against the sidewalls due to the capillary forces. Apparently, for the relatively wide recesses, the capillary forces are able to keep a sufficient amount of CPS for a sufficient period of time pinned against the sidewalls so that the thus accumulated CPS can be transformed into amorphous silicon. The same may apply to the submicron recesses wherein the capillary forces pin the CPS in the submicron recess thereby enabling the transformation of the CPS into amorphous silicon before the CPS is evaporated.

Moreover, little to no material was found in the recesses away from the sidewalls. Also the top surface of the template structure was substantially free from excess material, suggesting that the CPS in those areas was evaporated indeed. Hence, coating a template structure with pure CPS and annealing the CPS at a temperatures between 250° C. and 350° C., results in the formation of amorphous silicon submicron structures in the recesses, while the rest of the template structure was substantially free from CPS and/or amorphous silicon material.

Figure 4:
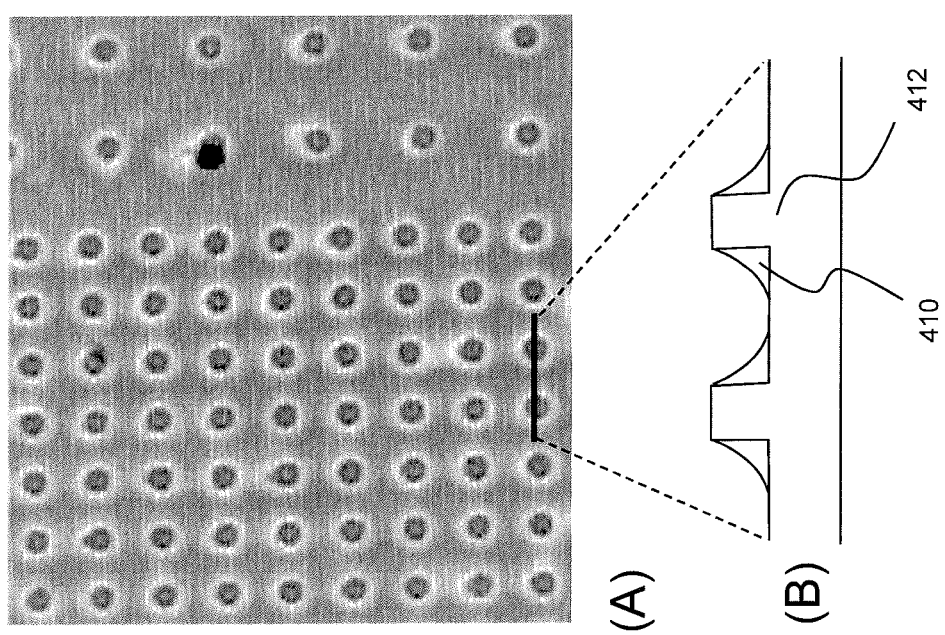
FIGS. 4A and 4B represent a photo of the top view of various submicron silicon structures and associated schematic cross-sections of the photographed structures according to various further embodiments of the invention.

FIGS. 4A and 4B depict a photo of a top view of a structured substrate comprising mesas, i.e. pillars or hillocks, that extend above the surface of the substrate and an associated schematic cross-sections of the photographed structures. The mesa may have a height of about 250 nm and a width of one micron. The structured surface may be coated with a layer of CPS and annealed in a similar way as described with reference to FIG. 3A-3C.

The photo clearly indicates a narrow (submicron) amorphous silicon filament 410 (ring) around each mesa 412 (a schematic cross-section is illustrated in FIG. 4B), while the rest of the surface was substantially free from (excess) amorphous silicon. Hence, also in this case, amorphous silicon structures may be formed around the mesa using annealing of a layer of non-UV irradiated CPS, which is provided over the surface of a substrate that is provided with a template structure. The results in FIG. 2A-2B may be used in the process of forming submicron polysilicon structures and devices as described with reference to FIG. 1A-1C.

Hence, on the basis of the processes described above, semiconducting structures of submicron cross-sectional dimensions on a flexible substrate may be formed using controlled (de)wetting of a template structure by ink. Submicron semiconducting filaments may be formed against the sidewalls of a recess in the substrate surface or against the sidewall of a mesa extending out of the substrate surface. The recess or mesa may function as a template that assists the formation of the semiconducting filaments, which are accurately aligned with the template structures. These template structures may be used in one or more further process steps in order to form aligned thin-film structures. This way, both small feature sizes, preferably submicron feature sizes within a range between 20 and 400 nm, preferably between 40 and 200 nm, and high alignment accuracy may be achieved.

The controlled wetting of the template structure may be used as a basis for a simple low-temperature process for manufacturing self-aligned submicron structures without the need of state-of-the art nanolithography techniques nor (vacuum-based) anisotropic etching processes. Wetting morphologies wherein one or more narrow ink filaments are pinned to the sidewalls of recessed regions in a patterned template layer may be used as a basis in the formation of nano-scale semiconducting, dielectric or metallic structures and electronic devices on a flexible substrate.

Figure 5:
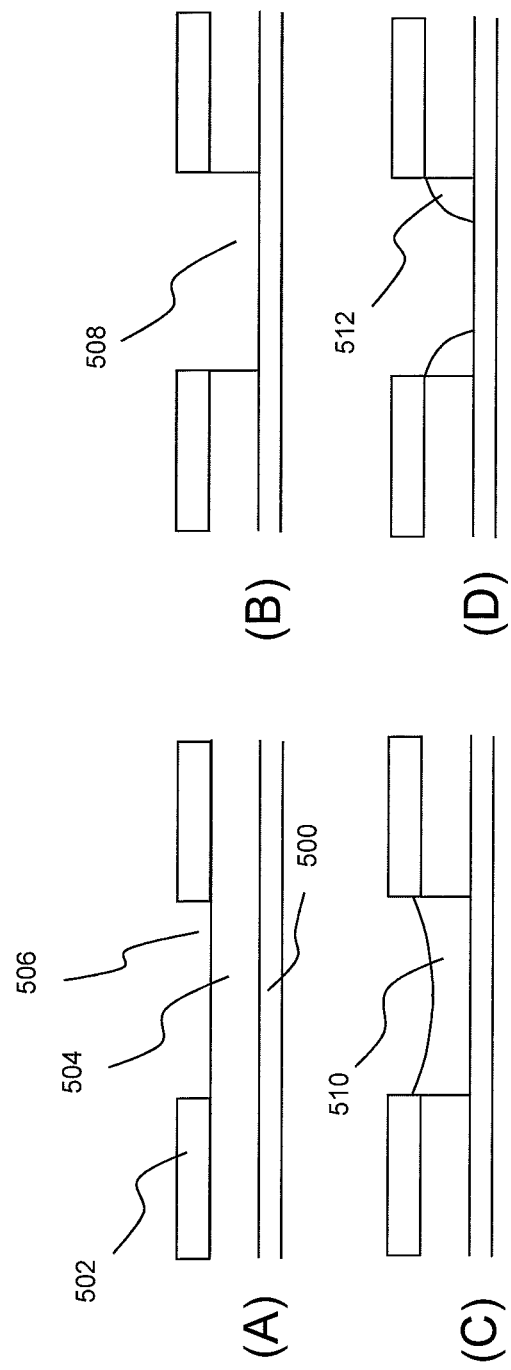
FIG. 5A-5D a method for forming a template structure on a support substrate according to an embodiment of the invention.

FIG. 5-7 depict various processes for forming template structures that allow control of the (de)wetting of a recess by an ink according to various embodiments of the invention. FIG. 5A-5D depicts a method for forming a template structure on a support substrate according to an embodiment of the invention wherein the material of the sidewalls of the recess has a high affinity for the ink. For example, in one embodiment, a first template layer 502 may be provided over a support substrate 500 wherein the ink has a high affinity for the material of the first layer (this material may be referred to as a high affinity material). Thereafter, a second template layer 504 may be formed on the first template layer wherein the ink has a low affinity for the material of the second layer (such material may be referred to as a low affinity material). Thereafter, one or more openings 506 may be formed in the second template layer thereby exposing the first template layer. A suitable etching step may be used to open the first template layer up to the support substrate. This way, a template structure may be formed comprising one or more recesses and/or mesas 508 comprising sidewalls of a high affinity material and a top surface of a low affinity material.

The template structures may be processed in a similar way as described with reference to FIG. 1A-1C. For example, after coating the template structure with an ink, a doctor blade technique may be used to fill the recess at least partly with an ink 510 as depicted in FIG. 5C. The coated template structure may then be subjected to thermal and/or optical anneal. During annealing, a substantial part of the ink may be accumulated and pinned to the high affinity material of the sidewalls. This way, when using a semiconductor ink (such as CPS or CHS) submicron amorphous or (poly) silicon filaments 512 may be formed along the sidewalls in the recesses. Further, during annealing, the central area of the recess away from the sidewalls may be dewetted so that no or very little silicon is formed at the central part of the recess. Hence, the template layer may comprise several thin-film layers that are selected to have certain wetting properties so that the (de)wetting behavior of the ink inside and/or outside the recess may be controlled.

FIG. 6A-6D depicts a method for forming a template structure on a support substrate according to an embodiment wherein the base of the recess is structured in order to enable controlled formation of submicron structures in the recess and/or against a mesa. The process may start with the formation of a template layer on a support substrate. A recess 606 may be formed wherein the base of the recess is angled. In particular, the centre part of the base is at a high level than the parts along the sidewalls such that the angle between the sidewall and the base is smaller than 90°. This way, a trench 608 is formed along the sidewalls, which allows accumulation and concentration of ink therein. Hence, after filling the recess with an ink 610 in a similar way as described with reference to FIGS. 1A and 1B. Then, during annealing, the wetting of the sidewalls and dewetting of the central region of the recess may be enhanced by the angled base so that (cross-sectional) submicron structures are formed more effectively along the sidewalls of the trench.

It is submitted that many different template topologies may be used in order to provide controlled formation of submicron structures in a recess and/or against a mesa. For example, in the embodiment of FIG. 7A the sloped sidewalls in a recess may form a V-shaped recess 702. During annealing of an ink-filled V-shaped recess, a single submicron structure 704 may be formed at the base of the V-shaped recess wherein the angled sidewalls pin the ink at the base of the recess. In the embodiment of FIG. 7B, a mesa 706 may be formed in the template layer. The base close the mesa-sidewall may have an angle, which is smaller than 90°. This way, a trench is formed along the sidewalls, which allows accumulation and concentration of ink therein. This way, a submicron structure 708 may be formed against the sidewall of the mesa.

Hence, the micron-sized template structures in FIGS. 6 and 7, which may be formed using a simple micro-imprint technique, allow controllable formation of submicron (nano-sized) structures by coating the template structure and controllable (de)wetting of ink on parts of the template structure.

Figure 8:
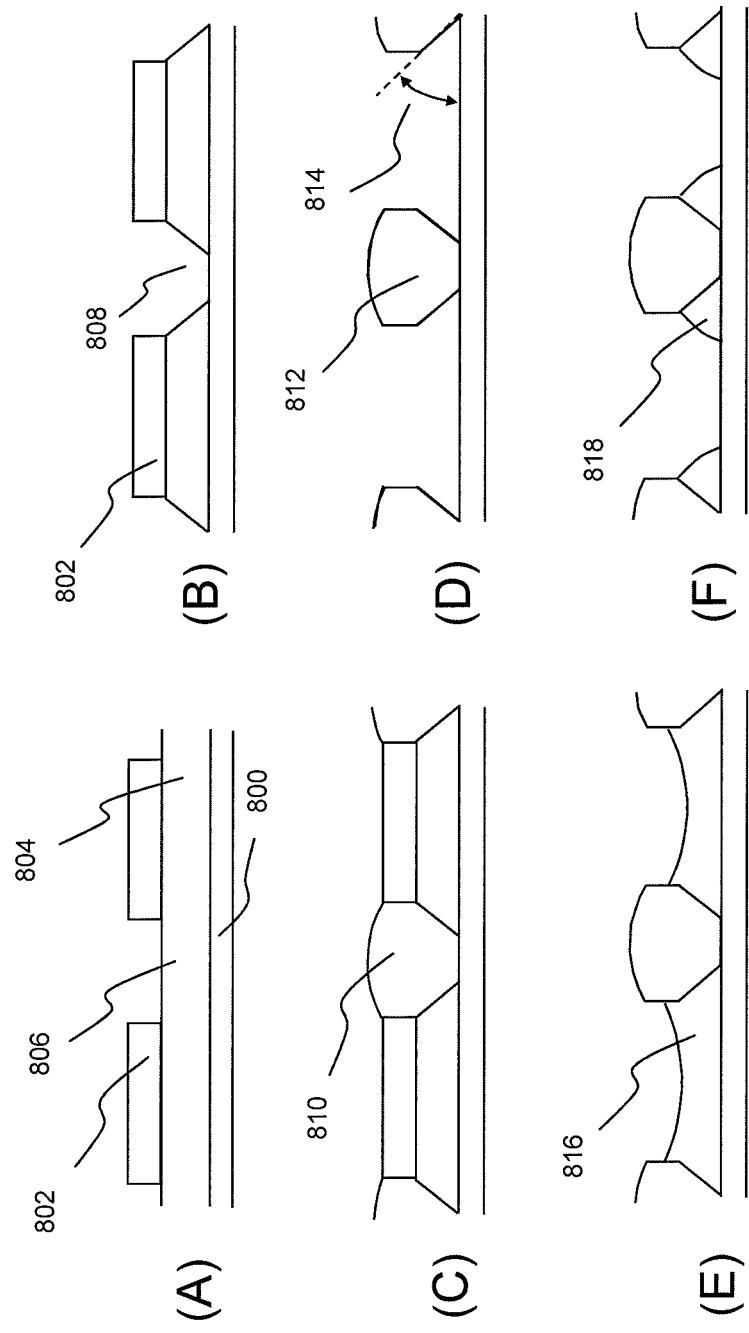
FIG. 8A-8F schematically depicts a process for forming at least part of a semiconducting device according to an embodiment of the invention.

FIG. 8A-8F depicts a method for forming a template structure on a support substrate according to an embodiment wherein the sidewalls of a recess and/or mesa are oriented under angle with the base, which is smaller than 90°. FIG. 8A depicts the start of the process with a formation of a first layer 802 on a support substrate 800. A further second layer 804 may be formed on said first layer and openings 806 may be formed in said second layer using a suitable etching step such that parts 806 of the first layer are exposed. Then, the patterned second layer 802 may be used as an etch-stop layer in order to form openings 808 (e.g. holes) in the first layer so that part of the support substrate is exposed as depicted in FIG. 8B. The opening in the first layer may be formed using an isotropic etch so that the openings (holes) in the first layer may have sloped sidewalls. The holes may be filled with a dielectric precursor 808, e.g. TEOS, by applying a coating over the structured layers and using a doctor blade technique in order to remove the excess material (FIG. 8C). An annealing step may be used to solidify the dielectric precursor. Thereafter, the first and second layers may be removed using a suitable etch process and a further annealing step may be used to transform the dielectric into a solid-state dielectric material. This way, a template structure on top of the support comprising $SiO_2$ deposited from TEOS mesa structures 812 may be formed wherein the angle 814 between the side wall and the base of a mesa is smaller than 90° (FIG. 8D).

The template structure may be coated with an ink 816 as depicted in FIG. 8E. Thereafter, the coated template structure may be thermally annealed. During annealing, the capillary forces will draw the ink towards and up against the sloped sidewalls of the mesa structures (in a similar way as depicted in FIG. 4B). This way, self-aligned submicron structures 818, e.g. (poly)silicon submicron structures, may be formed against the sloped sidewalls all around the mesa as depicted in FIG. 8F. This way, self-aligned (circular or ring-type) semiconducting submicron structures may be formed which may form (at least) part of a gate and/or a source of a TFT structure.

Figure 9:
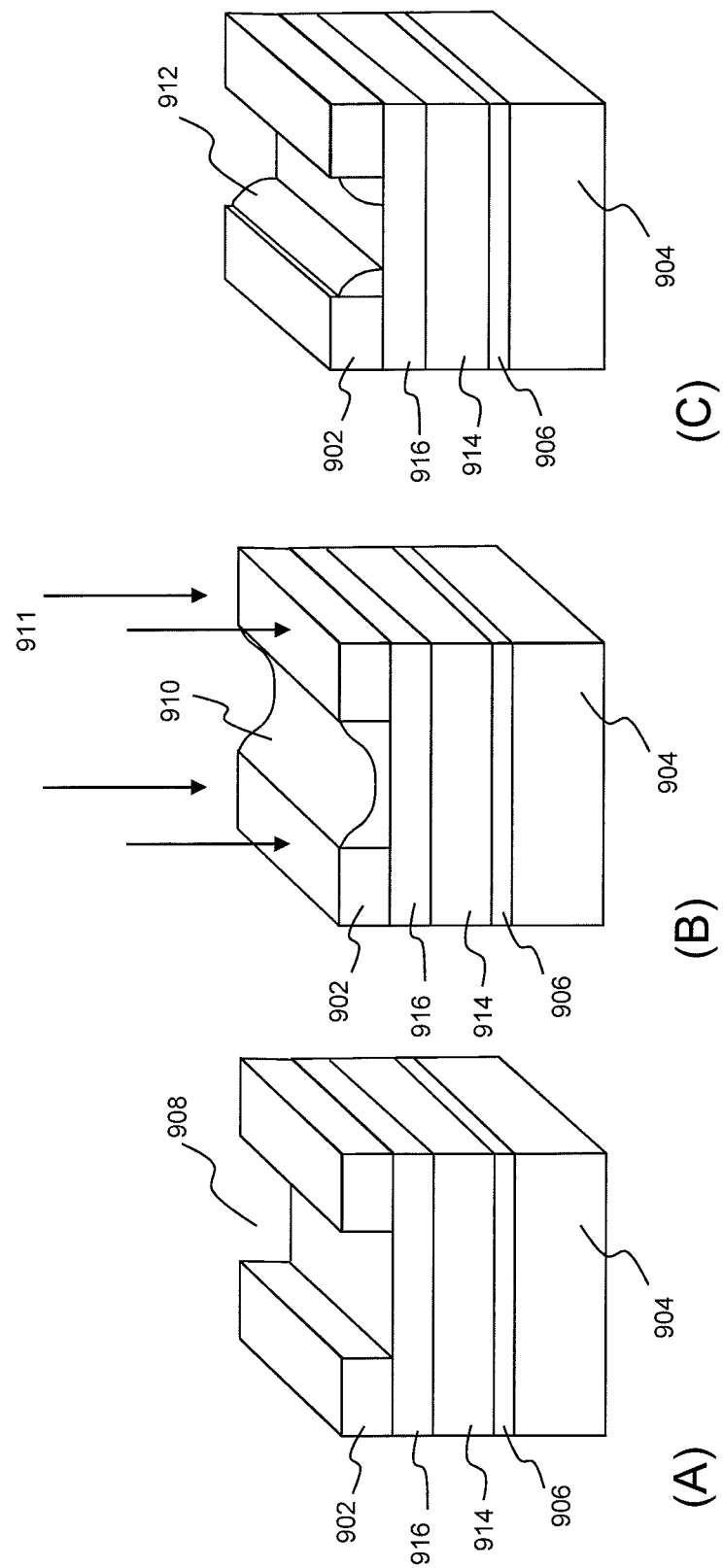
FIG. 9A-9I schematically depicts a process for the manufacture at least part of a semiconducting device according to an embodiment of the invention.
Figure 9:
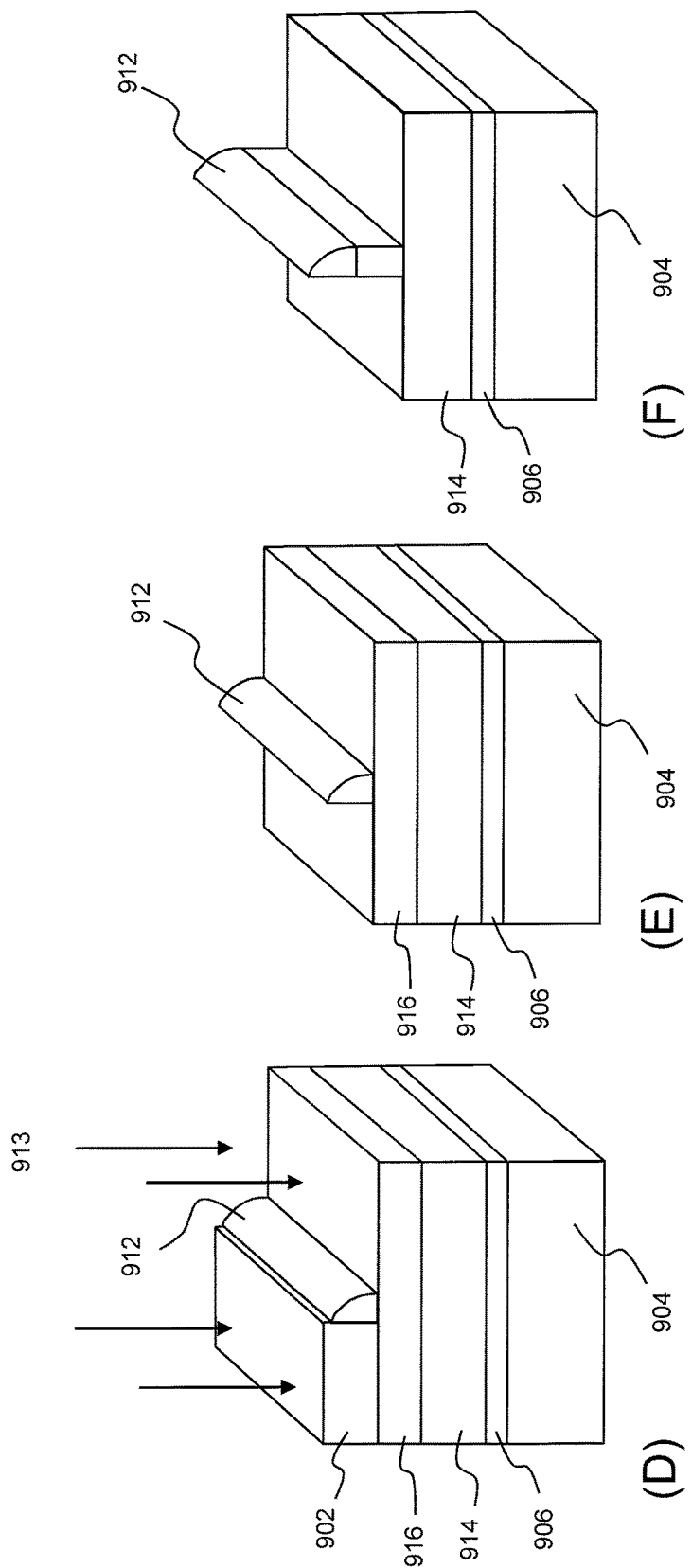
Figure 9:
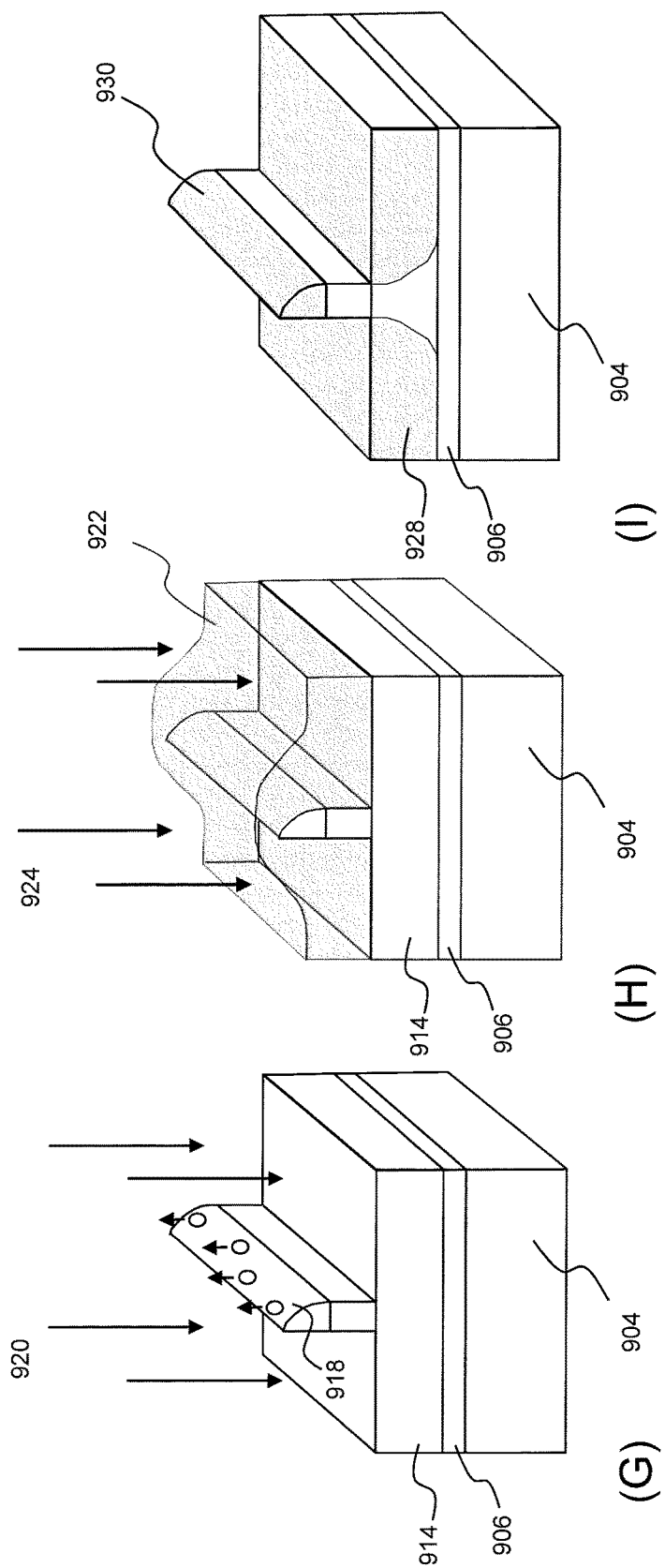

FIG. 9A-9I schematically depicts a process for the manufacture at least part of a semiconducting device according to an embodiment of the invention. FIG. 9A depicts a template structure on a thin-film stack 906, 914, 916 which is provided on a support substrate 904. In an embodiment, the support substrate may comprise a plastic foil. In one embodiment, the plastic material may be selected from one of: a poly(ethyleneterephthalate) (PET), poly(ethylenenaphthalate) (PEN), a polyimide-based foil and/or derivatives thereof.

In one embodiment, the plastic foil may be covered by a suitable barrier layer 906, including $SiO_2$ and/or $Si_2N_3$ layers. The barrier layer may be covered with a semiconductor layer 914 (e.g., a (poly)silicon layer). The semiconductor layer may be used as the channel semiconductor of a TFT structure. The semiconductor layer may be covered with a thin insulating layer (e.g., $SiO_2$ or $Al_2O_2$), which may be used as the gate insulator.

The insulation layer may be formed using a suitable low-temperature deposition process, including a coating process or a combined deposition and oxidation process at an atmospheric pressure. On top of the insulating layer, a patterned template structure 902 may be formed comprising one or more recessed regions 908. In an embodiment, the recess region may be defined by thin-film sidewalls of a template layer and the base of the recess may be formed by the top surface of the insulating layer 916. The patterned template structure may comprise one or more recessed regions which may be formed in a similar way as described above with reference to FIG. 1A.

Thereafter, in FIG. 9B an ink comprising a liquid semiconductor precursor, preferably a group IV semiconductor precursor, may be applied to the surface of the patterned thin-film layer in a similar way as described with reference to FIG. 1B. In one embodiment the liquid-phase semiconductor precursor may comprise a cyclosilane-based precursor. In another embodiment the cyclosilane-based precursor may comprise cyclopentasilane (CPS). In yet another embodiment, the cyclosilane-based precursor may comprise cyclohexasilane (CHS). CPS or CHS may be transformed into a solid-phase amorphous silicon by using a suitable low-temperature anneal in combination with UV and/or micro-wave irradiation.

In order to maintain good wetting properties of the CPS and to achieve a liquid silicon layer, which provides good coverage of the structured template layer, non-UV exposed li-Si may be used. After coating the template layer with the liquid silicon layer, a doctor-blade may be used to sweep the surface. This operation will scrape off the excess li-Si and fill at least part of the recessed regions with the li-Si 910.

Thereafter, a submicron semiconductor structure may be formed in the recess as depicted in FIG. 9C. In an embodiment, the liquid silicon layer may be exposed to UV light 911, which may at least partly polymerize the li-Si into polysilane which has an increased boiling point, so that the li-Si is more stable for handling in the subsequent thermal anneal. If a positive photo-resist is used for the patterned template layer, UV exposure will cause DNQ to dissolve into Novolac so exposed photoresist parts may be easily removed in a subsequent development step.

Irradiating the liquid silicon in the recessed region with UV light for a predetermined amount of time (e.g. 5-30 minutes) may change the surface energy (or surface tension) of the li-Si and as a result the contact angle. This way, the li-Si will be concentrated at and pinned to at least part of the sidewalls of the recessed region while the central regions of the recessed region is dewetted. The li-Si concentrated at the sidewalls of the recess may form a poly-silane filament wherein the width of the filament (wire) 912 may have submicron cross-section dimensions. The thus formed filaments are substantially smaller than the width of the recessed region, which may be formed using conventional micro-imprinting. As will be described hereunder in more detail, the submicron filament structures may be used to form a TFT gate of submicron gate length.

It is submitted that the above-described UV exposure step is optional. In another embodiment, the support substrate including the li-Si coated template structure may be annealed using an annealing temperature selected between 200° C. and 350° C. In that case, amorphous silicon submicron structures may be formed along the sidewalls in the recess regions in a similar way as described with reference to FIG. 3.

The thermal anneal may be combined with UV light exposure and/or a micro-wave radiation treatment 913 (FIG. 9D, only one filament is shown) so that the polymerized silicon-halide material of the gate structure 912 may be converted into amorphous silicon at a reduced annealing temperature.

After transformation of the li-Si into a-Si, at least part of the patterned template layer may be removed by a suitable removal step. In an embodiment, if $SiO_2$ is used for the template layer, an HF solution may be used as a wet-etchant. In another embodiment, if a photoresist is used for the patterned sacrificial layer, a proper developer may be used to remove the resist material. This way, a submicron gate structure comprising amorphous silicon wire 912 may be formed over a gate-insulating layer as depicted in FIG. 9E. The gate insulator outside the gated area may be subsequently removed using an appropriate wet etch (FIG. 9F) thereby exposing poly-silicon areas on both sides of the gate structure.

Thereafter, in one embodiment, an optional dehydrogenation step may be performed in order to reduce the hydrogen concentration in the amorphous silicon of the gate structure (FIG. 9G). Reduction of the hydrogen concentration may be useful in order to avoid silicon eruption due to excessive hydrogen effusion during a crystallization step. In one embodiment, the dehydrogenation step may be performed by annealing the amorphous silicon of the gate structure and the source drain areas using a laser or a flash lamp emitting light in a suitable part of the electromagnetic spectrum. In an embodiment, the light may be selected from a wavelength between 200 and 800 nm. In another embodiment, a pulsed (excimer) laser (308 nm, 250 ns) may be for a dehydrogenation anneal. Multiple shots laser irradiation 820 of low energy densities in the range between 50 and 300 $mJ/cm^2$ may be used in order diffuse the hydrogen 818 out of the amorphous silicon. This way the hydrogen concentration in the amorphous silicon may be reduced from around 10-20 at % to concentrations below 5 at %. In one embodiment, energy densities may be gradually increased from a first energy density value (e.g. 10, 20, 30, 40 or 50 mJ/cm$^2$) to a second energy density value (e.g. 50, 100, 150, 200, 250 or 300 mJ/cm$^2$). In another embodiment, the number of shots for each energy density may be decreased from a first number of shots (e.g. 100, 80, 60, 40, 20 or 10 shots) to a second number of shots (e.g. 5, 4, 3, 2 or 1 shorts).

In order to define source and drain areas and to realize a high-conductive poly-silicon gate, an appropriate dopant source may be deposited on the structure. For example, in one embodiment source, drain and gate areas may be covered with a highly doped spin-on glass (SOG) or a spin-on dopant (SOD) layer 920 (FIG. 9H).

Then, the amorphous silicon may be irradiated with a pulsed laser 924 with energy densities in the range between 300 and 1200 mJ/cm$^2$. Because the SOG is transparent for the laser light, the light is mainly absorbed by the gate silicon and silicon source drain areas. Thus the laser shots may locally heat up the exposed areas so that the dopants diffuse into the silicon layer forming doped regions 928 which may function as source drain regions and a doped silicon gate structure. Furthermore, when laser pulses with sufficient energy density is used, the absorbed heat in the amorphous silicon of the gate structure will locally melt the amorphous silicon and crystallize it into a doped polycrystalline-Si. After formation of the doped areas and the crystallization of the gate structure metal electrodes may be connected to the source and the drain regions and to the silicon gate structure (not shown). This way the main, basic TFT structure is completed (FIG. 9I).

It is to be understood that the invention is not limited to the descriptions but may also include embodiments as described hereunder. In one aspect, the invention may relate to a method for manufacturing a submicron semiconductor structure comprising: forming at least one template layer over a support substrate; forming one or more template structures, preferably one or more recesses and/or mesas, in said template layer, said one or more template structures comprising one or more edges; coating at least part of said one or more template structures with a liquid semiconductor precursor, preferably a liquid silicon precursor; and, annealing and/or exposing said liquid semiconductor precursor coated template structures to light, wherein during said annealing and/or light exposure a part of said liquid semiconductor precursor accumulates by capillary forces against at least part of said one or more edges, said annealing and/or light exposure transforming said accumulated liquid semiconductor precursor into one or more submicron semiconductor structures, preferably one or more submicron semiconducting wires, extending along at least part of said one or more edges.

In one embodiment said one or more edges define at least part of a recess and/or a mesa, wherein the depth of said recess and/or the height of said mesa is selected between 20 and 2000 nm, preferably 40 and 1000 nm, more preferably between 50 and 500 nm; and/or wherein the width of said one or more recesses and/or mesas are selected from a range between 40 and 5000 nm, preferably between 80 and 2000 nm, more preferably between 100 and 1000 nm.

In an embodiment said one or more edges define one or more faces, wherein the angle between said one or more faces and the top surface of said template layer is selected from a range between 30 and 120 degrees.

In an embodiment, the topology of said one or more recesses and/or mesa is configured such that said accumulation of said liquid semiconductor precursor against said one or more edges by said capillary forces is stimulated.

In an embodiment said one or more recesses have a substantially trapezoidal, rectangular, or triangular (V-shaped) cross-section.

In an embodiment said template layer comprises at least a first and second template layer wherein the first template layer comprises a material that has a higher affinity for the liquid semiconductor precursor than the material of said second template layer.

In an embodiment said annealing includes exposing at least part of said coated template structures to a temperature which is higher than the boiling temperature of said liquid semiconductor precursor.

In an embodiment said annealing includes exposing at least part of said coated template structures to a temperature selected from a range between 150 and 350° C., preferably between 180 and 340° C., more preferably between 200 and 320° C.

In an embodiment said light exposure includes exposing at least part of said one or more coated template structures to light comprising one or more wavelengths selected from a range between 200 nm and 800 nm; and/or, exposing at least part of said one or more coated template structures with light associated with an energy density selected in the range between 10 and 1000 mJ/cm$^2$, preferably 20 and 600 mJ/cm$^2$, more preferably 40 and 600 mJ/cm$^2$.

In an embodiment said method further comprises: coating at least of part of said template structures with a liquid silicon precursor or doped liquid silicon precursor, preferably said liquid silicon precursor being defined by the general formula $Si_nX_m$, wherein X is a hydrogen; n is an integer of 5 or greater, preferably an integer between 5 and 20; and m is an integer equal to n, 2n−2, 2n or 2n+1; more preferably said liquid silicon precursor comprising cyclopentasilane (CPS) and/or cyclohexasilane; and, preferably said doped liquid silicon precursor being defined by the general formula $Si_iX_jY_p$, wherein X represents a hydrogen atom and/or halogen atom and Y represents an boron atom or a phosphorus atom; wherein i represents an integer of 3 or more; j represents an integer selected from the range defined by i and 2i+p+2; and, p represents an integer selected from the range defined by 1 and i.

In an embodiment said method comprises: annealing said coated template structures at a temperature higher than 150° C., preferably at a temperature selected between 180 and 350° C., more preferably between 200 and 320° C. for transforming at least part of said liquid silicon precursor into amorphous silicon.

In an embodiment said method comprises: exposing said coated template structures to light, preferably light comprising one or more wavelengths selected between 200 nm and 800 nm, for transforming at least part of said liquid silicon precursor into a solid-state silicon, preferably amorphous silicon, polycrystalline silicon, micro-crystalline silicon or nano-crystalline silicon.

In an embodiment forming said one or more template structures includes: forming a template layer by coating the surface of said support substrate with a liquid precursor, preferably said liquid precursor comprising a polymer, a metal precursor or a metal-oxide dielectric precursor; annealing said template layer; forming at least part of said template structures into said template layer using an imprint technique, preferably a micro-imprint or a nano-imprint technique.

In an embodiment wherein said support substrate comprises: a flexible substrate layer, preferably a metallic, ceramic or plastic substrate layer; a semiconductor layer provided over at least part of said flexible substrate layer, preferably said semiconducting layer comprising amorphous silicon, polycrystalline silicon, micro-crystalline silicon or nano-crystalline silicon; a gate insulating layer provided over at least part of said semiconductor layer, wherein said template layer is formed over at least part of said gate insulating layer.

In an embodiment, said method comprises: doping at least part of said semiconducting submicron structure.

In an embodiment said method comprises: forming one or more contact electrodes, preferably one or more metallic contact electrodes, electrically connected said submicron semiconducting structure.

In an embodiment said submicron semiconducting structure is used as a submicron semiconductor channel or a submicron gate of a thin-film transistor.

In an embodiment said submicron semiconducting structure comprises one or more submicron semiconducting wires (filaments) formed against at least part of said one or more edges, said semiconductor wires having cross-sectional dimensions selected in a range between 20 and 800 nm, preferably between 50 and 600 nm, more preferably between 100 and 500 nm.

In a further aspect the invention may relate to a semiconductor submicron structure, preferably obtainable by the method as described above, comprising: a template layer on a flexible support substrate, preferably a plastic substrate, said template layer comprising one or more template structures comprising one or more recesses and/or mesas, wherein said recesses and/or mesas comprise one or more sidewalls; wherein the depth of said recesses and/or the height of said mesas is selected from a range between 40 and 800 nm, preferably 50 and 700 nm, more preferably between 60 and 600 nm; and, wherein at least one submicron semiconductor wire is arranged against said one or more sidewalls of said one or more recesses and/or mesas, preferably said submicron semiconductor wire comprising (hydrogenated) amorphous silicon or (hydrogenated) (poly) silicon.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A method for manufacturing a submicron semiconductor structure comprising:
    forming at least one template layer over a support substrate;
    forming one or more template structures comprising one or more recesses and/or mesas in said template layer, said one or more template structures comprising one or more edges in said template layer;
    coating at least part of said one or more template structures with a liquid semiconductor precursor; and,
    annealing and/or exposing said liquid semiconductor precursor coated template structures to light, wherein during said annealing and/or light exposure a part of said liquid semiconductor precursor accumulates by capillary forces against at least part of said one or more edges, said annealing and/or light exposure transforming said accumulated liquid semiconductor precursor into one or more submicron semiconductor structures extending along at least part of said one or more edges.

2. The method according to claim 1, wherein said one or more edges define at least part of a recess and/or a mesa, and wherein the depth of said recess and/or the height of said mesa is between 20 and 2000 nm.

3. The method according to claim 1 wherein said one or more edges define one or more faces, wherein the angle between said one or more faces and the top surface of said template layer is selected from a range between 30 and 120 degrees.

4. The method according to claim 1, wherein the topology of said one or more recesses and/or mesa is configured such that said accumulation of said liquid semiconductor precursor against said one or more edges by said capillary forces is stimulated.

5. The method according to claim 1 wherein said one or more recesses have a substantially trapezoidal, rectangular, or triangular cross-section.

6. The method according to claim 1, wherein said template layer comprises at least a first and second template layer wherein the first template layer comprises a material that has a higher affinity for the liquid semiconductor precursor than the material of said second template layer.

7. The method according to claim 1, wherein said annealing includes exposing at least part of said coated template structures to a temperature which is higher than the boiling temperature of said liquid semiconductor precursor.

8. The method according to claim 1, wherein said annealing includes exposing at least part of said coated template structures to a temperature selected from a range between 150 and 350° C.

9. The method according to claim 1, wherein said light exposure includes exposing at least part of said one or more coated template structures to light comprising one or more wavelengths selected from a range between 200 nm and 800 nm; and/or, exposing at least part of said one or more coated template structures with light associated with an energy density selected in the range between 10 and 1000 mJ/cm$^2$.

10. The method according to claim 1, wherein said semiconductor precursor is at least one of a liquid silicon precursor and a doped liquid silicon precursor.

11. The method according to claim 10, further comprising:
    annealing said coated template structures at a temperature higher than 150° C., for transforming at least part of said liquid silicon precursor into amorphous silicon.

12. The method according to claim 10, further comprising:
    exposing said coated template structures to light for transforming at least part of said liquid silicon precursor into a solid-state silicon.

13. The method according to claim 1 wherein forming said one or more template structures includes:
    forming a template layer by coating the surface of said support substrate with a liquid precursor;
    annealing said template layer; and
    forming at least part of said template structures into said template layer using an imprint technique.

14. The method according to claim 1 wherein said support substrate comprises:
    a flexible substrate layer;
    a semiconductor layer provided over said flexible substrate layer; and
    a gate insulating layer provider over said semiconductor layer, wherein said template layer is formed over said gate insulating layer.

15. The method according to claim 1, further comprising: doping at least part of said semiconducting submicron structure.

16. The method according to claim 1, further comprising: forming one or more contact electrodes electrically connected to said submicron semiconducting structure.

17. The method according to claim 1 wherein said submicron semiconducting structure is used as a submicron semiconductor channel or a submicron gate of a thin-film transistor.

18. The method according to claim 1, wherein said one or more edges define at least part of a recess and/or mesa, and wherein the width of said one or more recesses and/or mesas is from between 40 and 5000 nm.

19. The method according to claim 10, wherein said liquid silicon precursor is defined by the general formula $Si_nX_m$, wherein X is a hydrogen; n is an integer of 5 or greater; and m is an integer equal to n, 2n−2, 2n or 2n+1.

20. The method according to claim 10, wherein said liquid silicon precursor comprises cyclopentasilane (CPS) and/or cyclohexasilane.

21. The method according to claim 10, wherein said doped liquid silicon precursor is defined by the general formula $Si_iX_jY_p$, wherein X represents a hydrogen atom and/or halogen atom and Y represents an boron atom or a phosphorus atom; and wherein i represents an integer of 3 or more; j represents an integer selected from the range defined by i and 2i+p+2; and, p represents an integer selected from the range defined by 1 and i.

22. The method according to claim 12, wherein said light comprises one or more wavelengths selected between 200 nm and 800 nm.

23. The method according to claim 12, wherein said solid-state silicon comprises at least one of amorphous silicon, polycrystalline silicon, micro-crystalline silicon and nano-crystalline silicon.

24. The method according to claim 13, wherein said liquid precursor comprises at least one of a polymer, a metal precursor, and a metal-oxide dieletric precursor.

25. The method according to claim 13, wherein said imprint technique is a micro-imprint technique or a nano-imprint technique.

26. The method according to claim 14, wherein said flexible substrate layer comprises at least one of a metallic, ceramic or plastic substrate layer.

27. The method according to claim 14, wherein said semiconductor layer comprises amorphous silicon, polycrystalline silicon, micro crystalline silicon or nano crystalline silicon.

* * * * *